(12) United States Patent
Meunier et al.

(10) Patent No.: US 10,079,323 B2
(45) Date of Patent: Sep. 18, 2018

(54) FRAMING STRUCTURE FOR A SOLAR PANEL

(71) Applicant: SOLVAY SPECIALTY POLYMERS USA, LLC., Alpharetta, GA (US)

(72) Inventors: Vincent Pierre Meunier, Waterloo (BE); Jeffrey A. Hrivnak, Glen Mills, PA (US); Glenn P. Desio, Marietta, GA (US); Philippe Brasseur, Brussels (BE)

(73) Assignee: SOLVAY SPECIALTY POLYMERS USA, LLC., Alpharetta, GA (US)

( * ) Notice: Subject to any disclaimer, the term of this patent is extended or adjusted under 35 U.S.C. 154(b) by 141 days.

(21) Appl. No.: 14/380,116

(22) PCT Filed: Feb. 22, 2013

(86) PCT No.: PCT/EP2013/053601
§ 371 (c)(1),
(2) Date: Aug. 21, 2014

(87) PCT Pub. No.: WO2013/124440
PCT Pub. Date: Aug. 29, 2013

(65) Prior Publication Data
US 2015/0020871 A1    Jan. 22, 2015

Related U.S. Application Data

(60) Provisional application No. 61/602,924, filed on Feb. 24, 2012.

(51) Int. Cl.
*H02S 30/10* (2014.01)
*H01L 31/042* (2014.01)
(Continued)

(52) U.S. Cl.
CPC ...... *H01L 31/0424* (2013.01); *B29C 45/0001* (2013.01); *F24S 25/11* (2018.05);
(Continued)

(58) Field of Classification Search
CPC .......... H02S 30/10; C08L 77/00–77/12; F02E 10/47; Y02E 10/50; F24J 2/5211; F24J 2/5262; Y02B 10/12
(Continued)

(56) References Cited

U.S. PATENT DOCUMENTS 4,123,570 A    10/1978  Van Hijfte et al.
4,139,399 A *  2/1979   Lindmayer ........... H01L 31/048
                                                136/251
(Continued)

FOREIGN PATENT DOCUMENTS

EP    0672703 A1    9/1995
EP    1074585 A1    2/2001
(Continued)

OTHER PUBLICATIONS

Murphy J., in "Additives for Plastics Handbook", 2nd Edition, 2001, Chapter 5.2.3., p. 43-48—Elsevier Advanced Technology.

*Primary Examiner* — Brian E Glessner
*Assistant Examiner* — Daniel J Kenny
(74) *Attorney, Agent, or Firm* — Jarrod N. Raphael; Nikhil Patel

(57) ABSTRACT

The invention pertains to a framing structure for a solar panel made from a polymer composition (C) comprising at least one polyamide polymer [polyamide (A)], and at least one reinforcing filler [filler (F)], the framing structure being characterized by having a top surface and a bottom surface, said top surface having a depressed central portion sized for receiving a solar panel. It also relates to a method for manufacturing the same, to a method for assembly a solar panel into said framing structure, to a solar panel assembly comprising the same, and to a method for fixing said solar panel assembly onto a support (e.g. a roof).

12 Claims, 5 Drawing Sheets

(51) Int. Cl.
    *B29C 45/00*     (2006.01)
    *H01L 31/05*     (2014.01)
    *F24S 25/20*     (2018.01)
    *F24S 25/11*     (2018.01)
    *B29K 77/00*     (2006.01)
    *B29K 105/16*     (2006.01)
    *B29L 12/00*     (2006.01)
    *F24S 80/00*     (2018.01)

(52) U.S. Cl.
    CPC .............. *F24S 25/20* (2018.05); *H01L 31/05* (2013.01); *H02S 30/10* (2014.12); *B29K 2077/00* (2013.01); *B29K 2105/16* (2013.01); *B29L 2012/00* (2013.01); *F24S 2080/015* (2018.05); *Y02B 10/12* (2013.01); *Y02B 10/20* (2013.01); *Y02E 10/47* (2013.01); *Y10T 29/49826* (2015.01); *Y10T 29/49863* (2015.01)

(58) Field of Classification Search
    USPC .......... 428/13–14; 523/222; 524/14, 31, 35, 524/404, 424, 425, 439–445, 447–449, 524/451–452, 492–497
    See application file for complete search history.

(56) References Cited

U.S. PATENT DOCUMENTS

| | | |
|---|---|---|
| 4,892,927 A | 1/1990 | Meyer et al. |
| 5,346,984 A | 9/1994 | Hasegawa et al. |
| 5,959,069 A | 9/1999 | Gluck et al. |
| 7,514,147 B2* | 4/2009 | Davis .................... B32B 25/08 428/332 |
| 7,726,301 B2* | 6/2010 | Shin ........................ F24J 2/5233 126/704 |
| 2010/0132766 A1* | 6/2010 | Jenkins .................. F24J 2/5211 136/251 |
| 2010/0147362 A1* | 6/2010 | King ....................... F24J 2/4614 136/251 |
| 2010/0305257 A1 | 12/2010 | Trouillet-Fonti et al. |
| 2011/0030767 A1 | 2/2011 | Ehbing et al. |
| 2011/0120032 A1* | 5/2011 | Kernander ................ E06B 5/12 52/203 |
| 2011/0240930 A1* | 10/2011 | Stoeppelmann ........ C08L 77/00 252/511 |
| 2012/0245282 A1 | 9/2012 | Speroni et al. |
| 2015/0017458 A1* | 1/2015 | Mizumoto ............... B29D 5/02 428/458 |

FOREIGN PATENT DOCUMENTS

| | | |
|---|---|---|
| EP | 1186634 A1 | 3/2002 |
| WO | 9212194 A1 | 7/1992 |
| WO | WO 9635739 A1 | 11/1996 |
| WO | WO 9916829 A1 | 4/1999 |
| WO | WO 2011039183 A1 | 4/2001 |
| WO | WO 2005068303 A2 | 7/2005 |
| WO | WO 2006020402 A1 | 2/2006 |
| WO | WO 2007113262 A1 | 10/2007 |
| WO | WO 2009050268 A1 | 4/2009 |
| WO | WO 2009086238 A2 | 7/2009 |
| WO | WO 2011109629 A1 | 9/2011 |

* cited by examiner

FRAMING STRUCTURE FOR A SOLAR PANEL

This application is a U.S. national stage entry under 35 U.S.C. § 371 of International Application No. PCT/EP2013/053601, filed Feb. 22, 2013, which claims priority to U.S. Application No. 61/602,924 filed on Feb. 24, 2012. The entire content of each of these applications is hereby incorporated herein.

TECHNICAL FIELD

The invention pertains to a framing structure for a solar panel made from a polymer composition, to a method for manufacturing the same, to a method for assembly a solar panel into said framing structure and to a solar panel assembly comprising the same, and to a method for fixing said solar panel assembly onto a support (e.g. a roof).

BACKGROUND ART

Solar modules (or panels) including solar thermal or solar photovoltaic (PV) modules are attracting a great deal of attention as they are able to generate clean renewable energy without causing an increase of atmospheric carbon dioxide or other dangerous green house gases and have thus a strong positive influence on the climatic balance in the atmosphere.

A variety of solar module structures for commercial and residential appliances have been proposed. For example, solar PV modules structures are typically constructed as an assembly of PV individual modules having layered structure including a packed interconnected assembly of photovoltaic elements, also known as solar PV cells. Said layered structure generally includes a substrate that can be for example made of metal or glass or possibly flexible supports, a semiconductor active layer disposed on said substrate, and a transparent and/or conductive layer disposed on said semiconductor active layer. Protective means are also generally needed in a PV module, to protect it from heat, humidity and from any possible environmental exposure or risk during transport. The solar thermal modules structures comprise typically a flow inlet and a flow outlet and ducts for circulating a diathermic fluid (water or other fluid) ensuring a well-determined heat-exchange surface exposed to the incident solar radiation.

Techniques have also been developed for ensuring assembly of individual PV cells or of solar panels in arrays, providing mechanical connection and enabling mounting on target substrates (roofs, walls, . . . ) for ensuring fast fixture and proper angle of inclination for the interception of solar radiation.

Generally solar panels have been assembled and fixed to substrates through the use of aluminum frame. Although aluminum is a relatively light metal, its weight nevertheless contributes significantly to the total weight of the assembly. Further, such aluminum frames are manufactured from profiles which should undergo significant machining/mounting/welding/assembling steps for providing the frame, with significant associated costs, and which might severely limit the range of shapes accessible. Still, aluminum being an electrical conductor, some current lost is possible, detrimentally affecting overall efficiency of the array of solar modules.

The need was felt thus for making available structural support for solar modules which can be easily manufactured, which are lightweight, electrically non-conductive, possessing outstanding thermal resistance, low coefficient of expansion appropriate mechanical stability and which are able to withstand the long run effects of wind, rain, or sun.

Structural supports for solar modules made from synthetic plastics have been proposed in the past.

Thus, U.S. Pat. No. 4,123,570 Feb. 6, 1979 discloses a support for solar cell array made from a lightweight high strength plastic material, and more particularly from a polyester or a polyepoxide reinforced with fibers including glass, boron and carbon fibers. Nevertheless, these supports might not be appropriate for complying with the requirements of maintaining properties in a wide range of operating temperatures, like those which a PV modules arrays can be exposed when mounted outdoor, during both winter cold periods (with temperatures well below 0° C.) and sunny summer periods (with peak temperatures possibly reaching 85° C.).

Similarly, US 20110030767 Oct. 2, 2011 discloses frames for PV modules made of particular polyurethane elastomers, possibly filled with reinforcing fillers and comprising fire retardants. However, in order to reach the final properties of said polyurethane materials, complex, time consuming manufacturing processes are needed.

Further, in addition, properties of single components of a solar panel, including structural frames, junction boxes, and the like, have been recognized as critical for achieving overall certification of the assembly, including notably with regards to their anti-flame features: all those 'non-active' parts have thus attracted increasing attention so as to ensure their compliance with highly demanding UL laboratories standards.

As a whole, there is thus still a continuous need for alternative materials for structural support for solar modules which can fulfil all above detailed requirements.

SUMMARY OF INVENTION

The Applicant has now found that by using certain polyamide polymers composition it is possible to manufacture structural supports for solar modules which satisfy all above mentioned requirements, which can be manufactured by simple injection moulding technique into complex shapes, possibly integrating additional elements (like integrated junction boxes, rib stiffeners, channels or recesses for cables rooting), which possess a degree of flexibility useful for mounting therein the solar module, but simultaneously excellent stiffness to ensure appropriate fastening and mechanical assembly of the array, which can be easily glued for better fastening the solar module and which have outstanding electrical insulation and flame retardancy properties, so as to pass stringent requirements as those set by UL laboratories.

The invention thus pertains to a framing structure for a solar panel module made from a polymer composition (C) comprising at least one polyamide polymer [polyamide (A)], and at least one reinforcing filler [filler (F)], the framing structure being characterized by having a top surface and a bottom surface, said top surface having a depressed central portion sized for receiving a solar panel.

DESCRIPTION OF EMBODIMENTS

It is an object of the invention a framing structure for a solar panel module made from a polymer composition (C) comprising at least one polyamide polymer [polyamide (A)], and at least one reinforcing filler [filler (F)], the framing structure being characterized by having a top surface and a bottom surface, said top surface having a depressed central portion sized for receiving a solar module.

Figure 1:
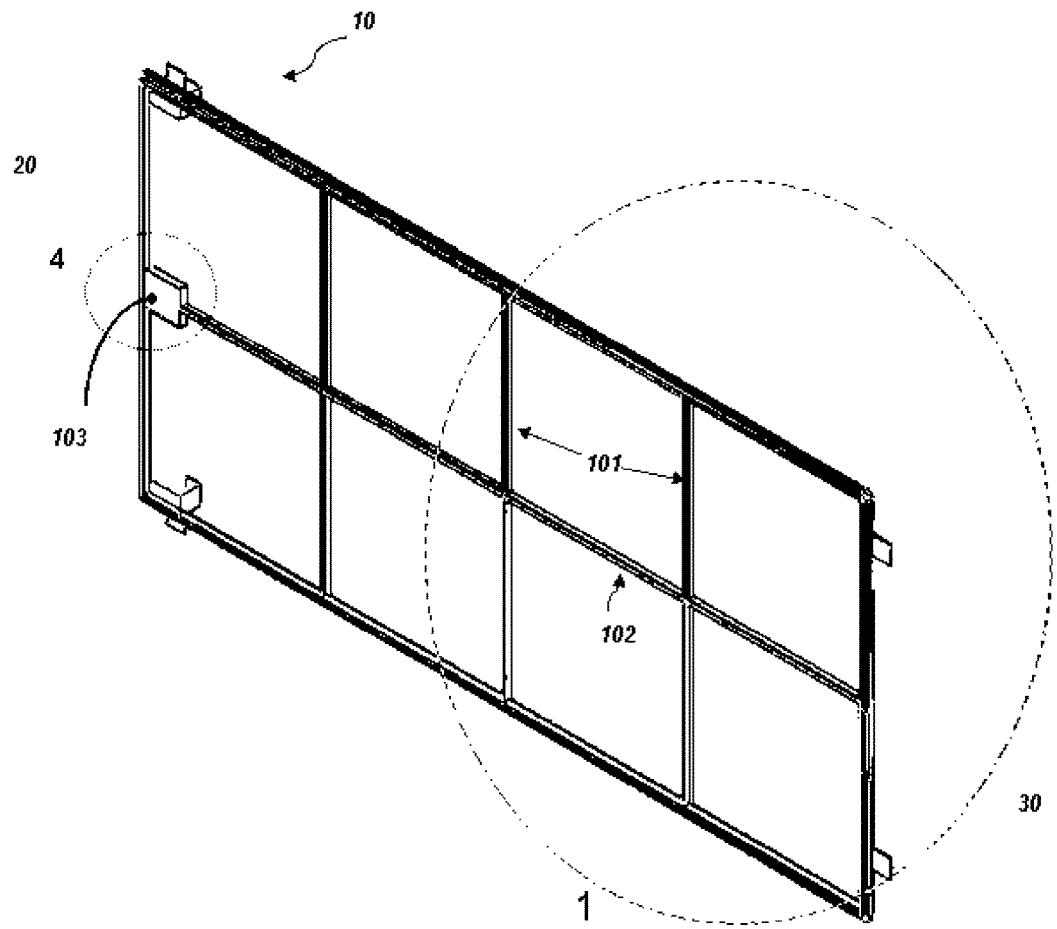
FIG. 1 illustrates a framing structure for a solar module possessing a rectangular shape, a junction box and longitudinal and lateral supporting ribs.

While the framing structure might possess whichever shape, it is generally understood that the frame will possess a rectangular shape as shown in FIG. 1, adapted to receive a rectangular solar module, which is the standard shape of commercially available solar modules.

Figure 2:
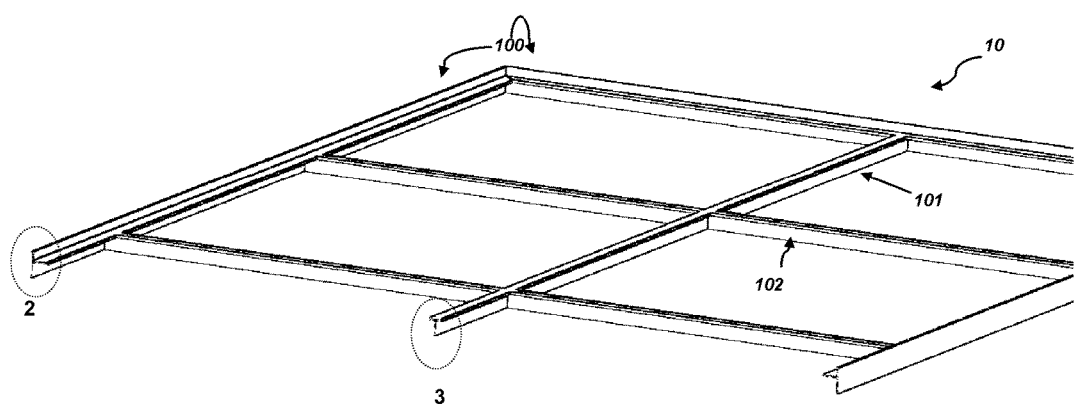
FIG. 2 illustrates an enlarged perspective top view of the area of the framing structure within the circle 1 of FIG. 1 to show the depressed central portion being sized to form a rectangular rim.
Figure 3:
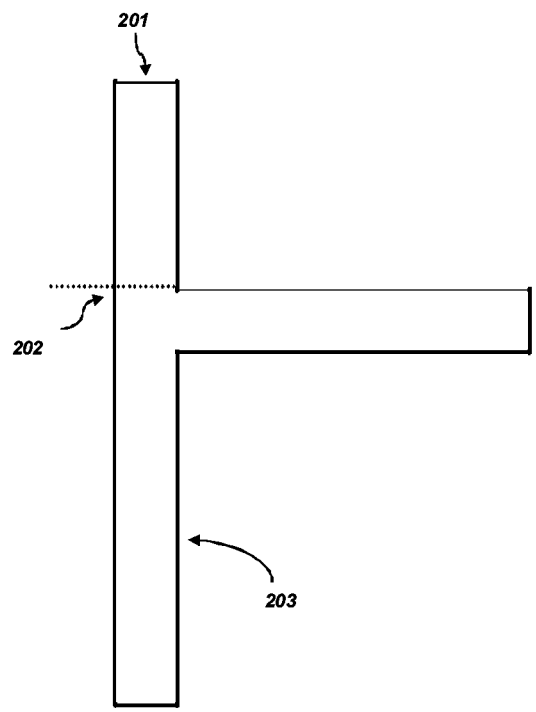
FIG. 3 illustrates an enlarged perspective side view of the area of the framing structure within the circle 2 of FIG. 2 to show the top and bottom surface of the perimeter wall and downwardly descending perimeter skirt.

According to certain embodiments, in the framing structure of the invention made from the polymer composition (C) of the present invention, the depressed central portion being sized to form a rectangular rim 100 as shown in FIG. 2 can have a perimeter wall at the top surface 201, as shown in FIG. 3 with a thickness ranging in general from 1 to 4 mm, preferably from 1 to 3 mm and more preferably from 1 to 2 mm. The thickness of said perimeter wall at the bottom surface 202 is generally advantageously in a range from 1 to 6 mm, preferably from 1 to 4 mm and more preferably from 1 to 3 mm. It is understood that thanks to the outstanding mechanical properties delivered by the polymer composition (C) as above detailed, the frame structure of the invention can be designed with such reduced thickness, as described above, resulting them in lightweight and a higher solar surface of the solar module. As can been seen from said FIG. 3 around the perimeter of the bottom surface 202 there can be a downwardly descending perimeter skirt 203.

Figure 4:
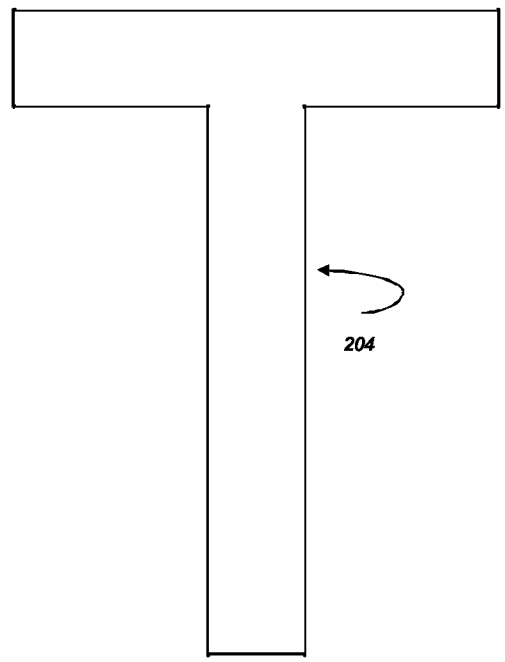
FIG. 4 illustrates an enlarged perspective side view of the area of the framing structure within the circle 3 of FIG. 2 to show the detailed structure of the ribs.

For ensuring fastening of the solar module, the framing structure of the invention generally comprises at least one type of supporting means. Due to the fact that the composition (C) is easily gluable, these supporting means, as well as the overall framing structure, can be advantageously glued to the components to be mounted upon, including not only the solar module, but also any other element, like covers, electronic packages, junction boxes, etc. . . . Among supporting means mention can be notably made of supporting ribs, which might be longitudinal 102 when parallel to longer dimension of the rectangular frame, or lateral supporting ribs 101, when parallel to the shorter dimension of the rectangular frame, or angular supporting ribs, in any other direction. In a specific embodiment, as can be seen from FIG. 2, longitudinal ribs 102 which are spaced apart in parallel relationship and are connected to each other by lateral ribs 101. Said ribs typically extend downwardly 204, as shown in FIG. 4, in a distance similar to the perimeter skirt 203. Said distance is generally in the range of about 2 to 20 cm; the skilled in the art will arrange this distance as a function of the overall design of the frame.

Figure 5:
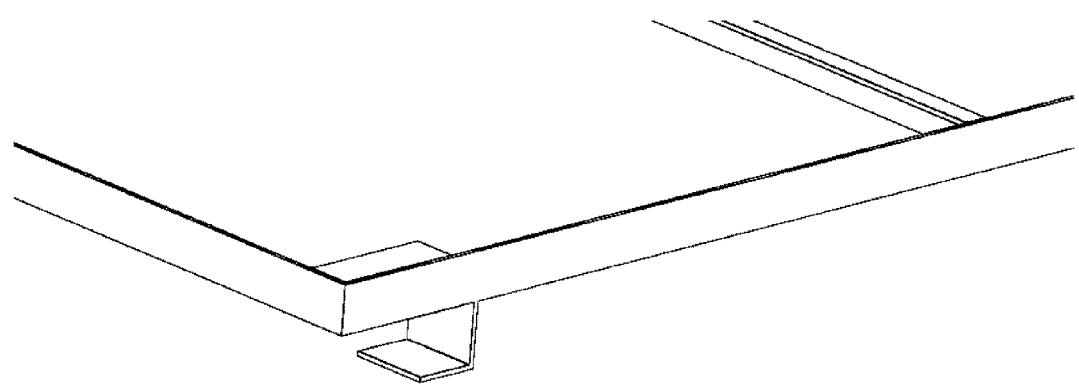
FIG. 5 illustrates an enlarged perspective side view of the area of the framing structure to show a fixing mean for the attachment of the solar module to the respective substrate to which it should be affixed.

The framing structure of the invention usually not only serves for sealing the solar module towards the exterior and for increasing its rigidity and its stability; rather the framing structure affects also the attachment of the solar module to the respective substrate to which it should be affixed. To this aim the framing structure of the invention can additionally comprise at least one type of fixing means, including, but not limited to, recesses, holes, screw holdings and the like. While embodiments wherein said fixing means are made of said composition (C), embodiments wherein these fixing means are provided as inserts (metal inserts or inserts of material other than the composition (C)), are within the scope of the invention. An example thereof is shown in FIG. 5.

The framing structure of the invention is advantageously suited for being mounted on mounting systems fixed onto the substrate. Said mounting systems might have any type of shape. They are advantageously composed of profiles fixed in orthogonal directions in a plane which can be parallel to the surface of the substrate or which can form with such surface an angle a, being understood that this angle a is generally selected in the range from 0 to 45° for ensuring maximum exposure to incident radiation. According to preferred embodiments such mounting systems, which is another object of the invention can be made of composition (C), as detailed above.

Still, the framing structure of the invention can comprise means for bolting a number of framing structures (possibly including the solar panel) together.

Figure 6:
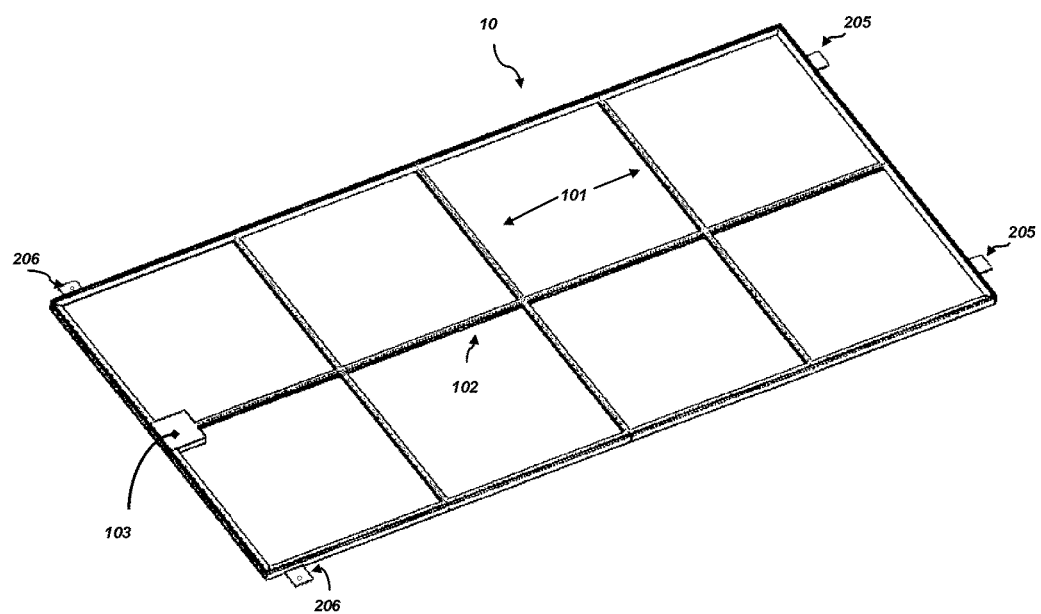
FIG. 6 illustrates a framing structure for a solar module possessing different types of bolting means.

While different types of bolting or fastening means can be used, according to certain embodiments at least a fraction of the perimeter of the perimeter skirt 203 may be provided with a plurality of fastening means, as illustrated in FIG. 6, including notably holes, protrusions with holes 206, protrusions 205 and matching recesses, screw holdings and the like.

While certain embodiments provide that said fastening means are made of said composition (C), embodiments wherein these fastening means are provided as metal inserts or inserts made of materials other than the composition (C), are also within the scope of the invention.

Figure 7:
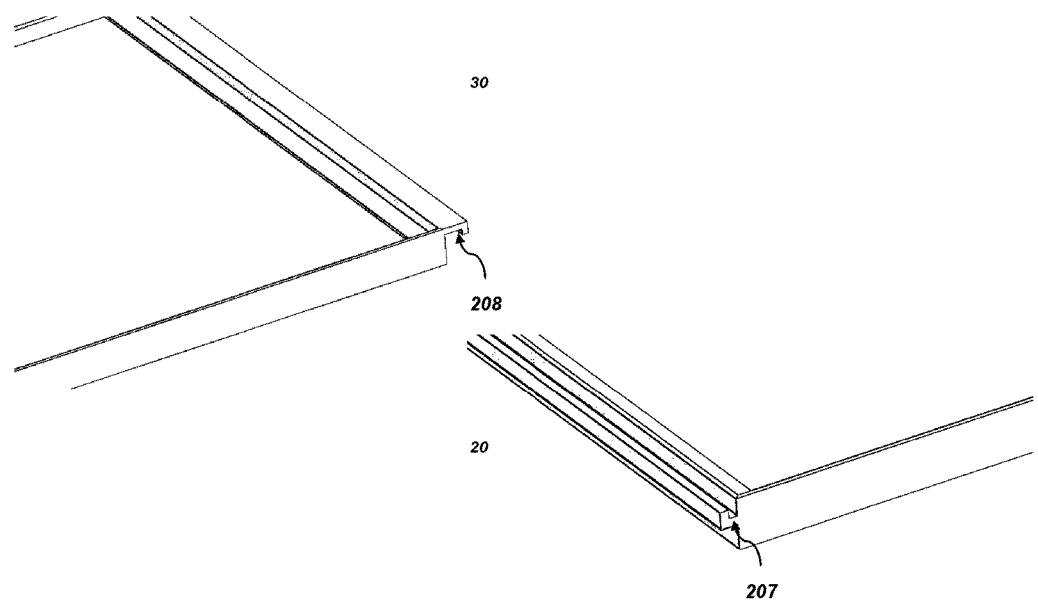
FIG. 7 illustrates the left and right interlocking portion that can be engaged with one another.

According to other embodiments, as illustrated in FIG. 7, the left side of the perimeter wall 20 can be extended by a left interlocking portion 207 and a the right side of the perimeter wall 30 can be extended to form a right interlocking portion 208 and both interlocking portions can be engaged with one another as shown in FIG. 7.

Figure 8:
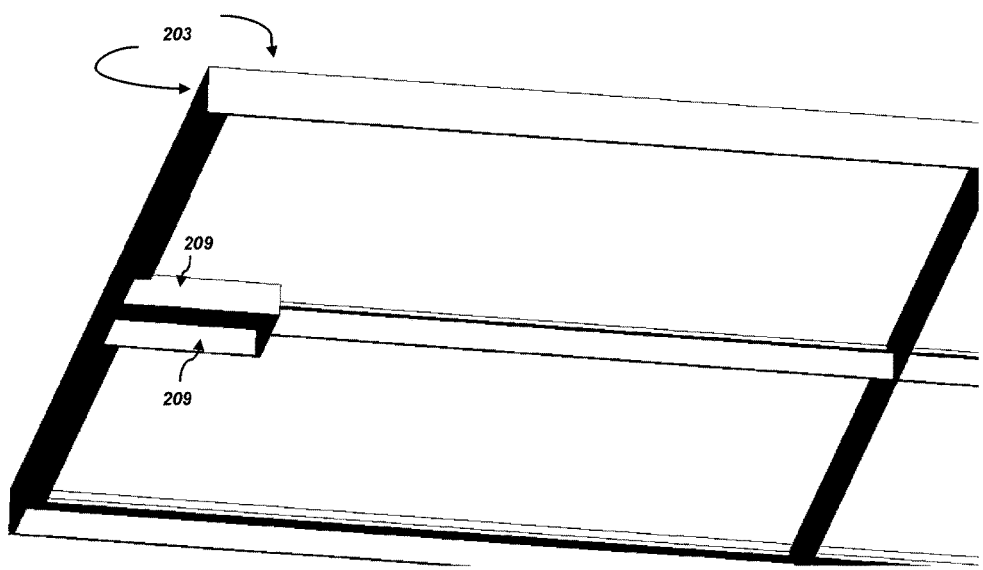
FIG. 8 illustrates an enlarged perspective view of a U-shaped channel which can be used for cable routing

Still, the framing structure of the invention, in particular for framing PV modules, can comprise at least one junction box 103 (FIG. 1); multiple junction boxes can also be comprised in the framing structure of the invention, in particular when multiple connections (series, parallel) are desired. According to certain embodiments, a junction box is molded on the bottom surface. For example, junction box 103, as shown in FIG. 8, is provided along one lateral end of the framing structure. The junction box 103 is formed by a plurality of downwardly extending walls 209. Optionally, posts can be provided at the corners of the junction box 103 to which a cover, if desired, can be mounted.

Still further, the framing structure of the invention, particularly for framing solar thermal panels, can comprise at least one type of holding means, for example for holding notably control equipments, including, but not limited to, flow controls, temperature sensor, pressure release valves and the like.

Figure 9:
FIGS. 9 and 10 illustrate specific embodiments of receptacles for collecting surface water and or rain water.

Further, the framing structure of the invention can comprise means for cable routing, for example in the form of a U-shaped channel as shown in FIG. 9 and/or inlet/outlet tubings. If desired, the U-shaped channel 210 can be covered to protect the cables. Other examples of cable routing means are notably flexible clips, recesses and other type of means can be mentioned.

Figure 10:
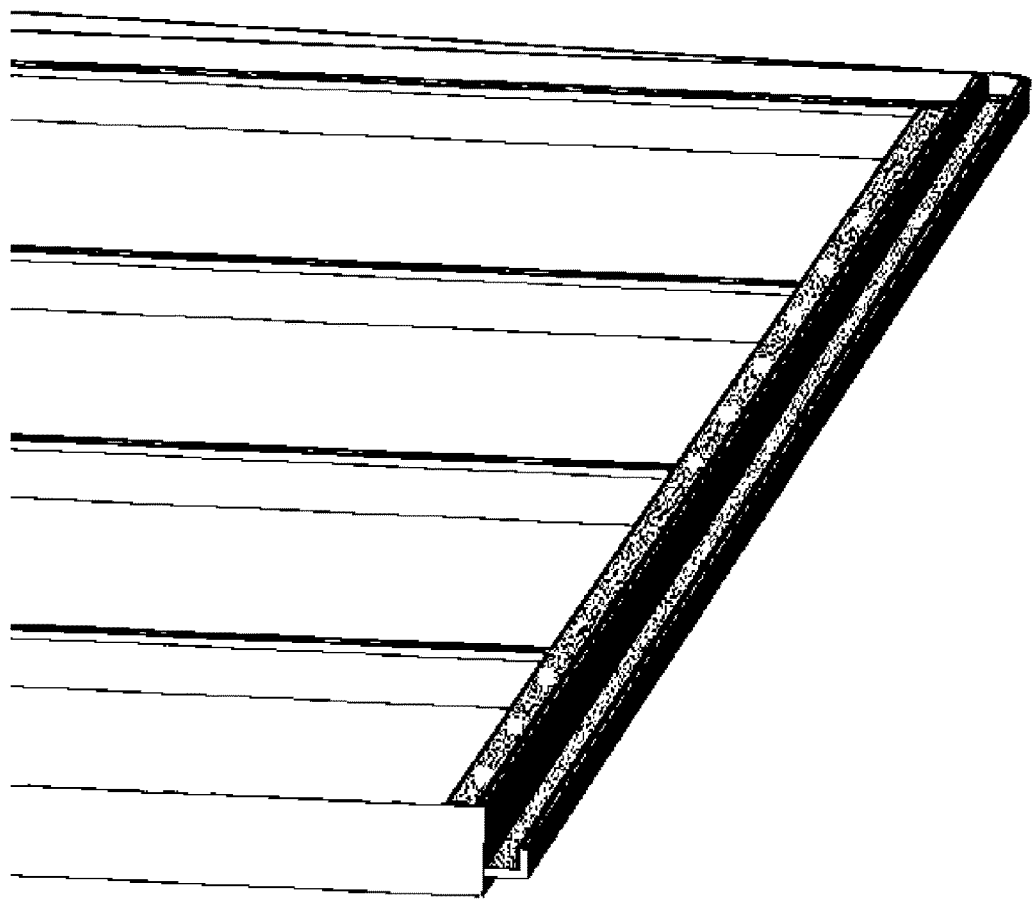

Still further, the framing structure of the invention can comprise receptacles for collecting surface water and or rain water. According to certain embodiments, at least a fraction of the perimeter wall of the framing structure can be provided with a side elongated frame element, as illustrated in FIG. 9. Said side elongated frame element can be situated anywhere between the top surface and the bottom surface, as illustrated in FIG. 10.

Receptacles for collecting surface or rain water may be provided as gutters; each frame can be equipped with completely formed gutters around its periphery or the structural frame can be provided with elongated frame elements which upon assembly with the adjacent structural frame in an array will provide the entire gutter design; with these regards, the framing structure of the invention is generally conceived as an asymmetrical structure, predisposed to be assemble with upper, lower left and right positions, with different slopes and shapes of elongated frames at each edge.

While the framing structure can be construed by assembling one or more of the elements as above described by known assembling techniques, including gluing, soldering, etc. . . . , due to the easy moldability of the composition (C), the framing structure may be provided as an unitary-bodied structure, which can be advantageously obtained by injection molding techniques.

The composition (C) can comprise one or more than one polyamide polymer [polyamide (A)].

For the purpose of the present invention, the term "polyamide polymer" should be understood as defining any polymer which comprises recurring units ($R_{PA}$) which are derived from the polycondensation of at least one dicarboxylic acid component, or derivative thereof, and at least one diamine component, and/or from the polycondensation of aminocarboxylic acids and/or lactams.

The expression 'derivative thereof' when used in combination with the expression 'carboxylic acid' is intended to denote whichever derivative which is susceptible of reacting in polycondensation conditions to yield an amide bond. Examples of amide-forming derivatives include a mono- or di-alkyl ester, such as a mono- or di-methyl, ethyl or propyl ester, of such carboxylic acid; a mono- or di-aryl ester thereof; a mono- or di-acid halide thereof; and a mono- or di-acid amide thereof, a mono- or di-carboxylate salt.

The dicarboxylic acid component and the diamine component are generally comprised in substantially equimolecular amount in the polyamide (A); this means that the molar ratio between the overall number of —COOH groups of the dicarboxylic acid component and the overall number of —NH$_2$ groups of the diamine component is of 1.1:1 to 0.9:1, preferably of 1.075:1 to 1:0.925.

In certain specific embodiments, it may be advantageous to use an excess of the dicarboxylic acid component or of the diamine component.

According to the present invention, the polymer composition (C) may comprise a polyamide (A) which is an aliphatic polyamide polymer and/or an aromatic polyamide polymer.

According to a first aspect of the present invention, the polymer composition (C) comprises preferably at least one aromatic polyamide polymer.

For the purpose of the present invention, the expression "aromatic polyamide polymer" is intended to denote a polyamide that comprises recurring units ($R_{PA}$) as above detailed, more than 35 mol % of said recurring units, preferably more than 45 mol %, more preferably more than 55 mol %, still more preferably more than 65 mol % and most preferably more than 75 mol % being aromatic recurring units.

For the purpose of the present invention, the expression "aromatic recurring unit" is intended to denote any recurring unit that comprises at least one aromatic group. The aromatic recurring units may be formed by the polycondensation of at least one aromatic dicarboxylic acid with a diamine or by the polycondensation of at least one dicarboxylic acid with an aromatic diamine, or by the polyaddition of aromatic aminocarboxylic acids and/or aromatic lactams.

According to a first embodiment, the aromatic polyamide comprises recurring units [recurring units ($R_{PPA}$)] deriving from the polycondensation reaction of:

(i-1) a dicarboxylic acid component [acid component (AA)], wherein said acid component (AA) comprises at least one aromatic dicarboxylic acid or derivative thereof [acid (AR)]; and (i-2) a diamine component [amine component (NN)] comprising at least one aliphatic alkylene-diamine [amine (AL)], and/or from the polycondensation reaction of:

(i-3) an aromatic aminocarboxylic acid [aminoacid component (ArN)], comprising at least one aromatic carboxylic acid comprising at least one amino group.

Recurring units ($R_{PPA}$) can thus be obtained from the polycondensation of an acid component (AA), a diamine component (NN), optionally in the presence of an aminoacid component (ArN), or can be obtained from the polycondensation of an aminoacid component (ArN), being understood that additional components, including end-capping, branch-point monomers or other non-aromatic monomers can be further used.

The acid component (AA) may comprise in addition to said at least one aromatic dicarboxylic acid [acid (AR)], one or more than one non-aromatic dicarboxylic acid [acid (AL)].

For the purpose of the present invention, a dicarboxylic acid is considered as "aromatic" when it comprises one or more than one aromatic group.

Non limitative examples of acids (AR) are notably phthalic acids [acids (PA)], including isophthalic acid (IA), terephthalic acid (TA) and orthophthalic acid (OA), 2,5-pyridinedicarboxylic acid, 2,4-pyridinedicarboxylic acid, 3,5-pyridinedicarboxylic acid, 2,2-bis(4-carboxyphenyl)propane, bis(4-carboxyphenyl)methane, 2,2-bis(4-carboxyphenyl)hexafluoropropane, 2,2-bis(4-carboxyphenyl)ketone, 4,4'-bis(4-carboxyphenyl)sulfone, 2,2-bis(3-carboxyphenyl)propane, bis(3-carboxyphenyl)methane, 2,2-bis(3-carboxyphenyl)hexafluoropropane, 2,2-bis(3-carboxyphenyl)ketone, bis(3-carboxyphenoxy)benzene, the 2,6-naphthalene dicarboxylic acid, 2,7-naphthalene dicarboxylic acid, 1,4-naphthalene dicarboxylic acid, 2,3-naphthalene dicarboxylic acid, 1,8-naphthalene dicarboxylic acid and 1,2-naphthalene dicarboxylic acid.

Among acids (AL), mention can be notably made of oxalic acid [HOOC—COOH], malonic acid [HOOC—$CH_2$—COOH], adipic acid [HOOC—$(CH_2)_4$—COOH], succinic acid [HOOC—$(CH_2)_2$—COOH], glutaric acid [HOOC—$(CH_2)_3$—COOH], 2,2-dimethyl-glutaric acid [HOOC—$C(CH_3)_2$—$(CH_2)_2$—COOH], 2,4,4-trimethyl-adipic acid [HOOC—$CH(CH_3)$—$CH_2$—$C(CH_3)_2$—$CH_2$—COOH], pimelic acid [HOOC—$(CH_2)_5$—COOH], suberic acid [HOOC—$(CH_2)_6$—COOH], azelaic acid [HOOC—$(CH_2)_7$—COOH], sebacic acid [HOOC—$(CH_2)_8$—COOH], undecanedioic acid [HOOC—$(CH_2)_9$—COOH], dodecandioic acid [HOOC—$(CH_2)_{10}$—COOH], tetradecandioic acid [HOOC—$(CH_2)_{11}$—COOH], cis- and/or trans-cyclohexane-1,4-dicarboxylic acid and cis- and/or trans-cyclohexane-1,3-dicarboxylic acid (CHDA).

According to preferred embodiments of the present invention, the acid component (AA) comprises advantageously at least one phthalic acid selected from the group consisting of isophthalic acid (IA), and terephthalic acid (TA). Isophthalic acid and terephthalic acid can be used alone or in combination. The phthalic acid is preferably terephthalic acid, optionally in combination with isophthalic acid.

The acid component (AA) according to this preferred embodiment comprises said phthalic acid in an amount of at least 35% moles, preferably at least 50% moles, based on the all components of the acid component (AA).

Said amines (AL) are typically aliphatic alkylene diamines having 2 to 18 carbon atoms.

Said amine (AL) is advantageously selected from the group consisting of 1,2-diaminoethane, 1,2-diaminopropane, propylene-1,3-diamine, 1,3-diaminobutane, 1,4-diaminobutane, 1,5-diaminopentane, 1,4-diamino-1,1-dimethylbutane, 1,4-diamino-1-ethylbutane, 1,4-diamino-1,2-dimethylbutane, 1,4-diamino-1,3-dimethylbutane, 1,4-diamino-1,4-dimethylbutane, 1,4-diamino-2,3-dimethylbutane, 1,2-diamino-1-butylethane, 1,6-diaminohexane (also called hexamethylene diamine), 1,7-diaminoheptane, 1,8-diamino-octane, 1,6-diamino-2,5-dimethylhexane, 1,6-diamino-2,4-dimethylhexane, 1,6-diamino-3,3-dimethylhexane, 1,6-diamino-2,2-dimethylhexane, 1,9-diaminononane, 1,6-diamino-2,2,4-trimethylhexane, 1,6-diamino-2,4,4-trimethylhexane, 1,7-diamino-2,3-dimethylheptane, 1,7-diamino-2,4-dimethylheptane, 1,7-diamino-2,5-dimethylheptane, 1,7-diamino-2,2-dimethylheptane, 1,10-diaminodecane, 1,8-diamino-1,3-dimethyloctane, 1,8-diamino-1,4-dimethyloctane, 1,8-diamino-2,4-dimethyloctane, 1,8-diamino-3,4-dimethyloctane, 1,8-diamino-4,5-dimethyloctane, 1,8-diamino-2,2-dimethyloctane, 1,8-diamino-3,3-dimethyloctane, 1,8-diamino-4,4-dimethyloctane, 1,6-diamino-2,4-diethylhexane, 1,9-diamino-5-methylnonane, 1,11-diaminoundecane and 1,12-diaminododecane.

A first group of preferred polyamides (A) are those consisting essentially of recurring units formed by the polycondensation reaction between at least one phthalic acid, chosen among isophthalic acid (IA), terephthalic acid (TA) and orthophthalic acid (OA) or derivative thereof, and at least one aliphatic alkylene-diamine. In the rest of the text, this first group of polyamides (A) is named, for the purposes of the invention, as polyphthalamides.

Suitable polyphthalamides are notably available as AMODEL® polyphthalamides from Solvay Specialty Polymers USA, L.L.C.

In addition to the at least one aliphatic alkylene-diamine, the amine component (NN) can further comprise at least one diamine different from said aliphatic alkylene-diamine;

Said additional diamine can notably be an aromatic diamine [amine (AR)], or a cycloaliphatic diamine [amine (CAL)].

Non limitative examples of amine (AR) are notably selected from the group consisting of m-phenylene diamine (MPD), p-phenylene diamine (PPD), 3,4'-diaminodiphenyl ether (3,4'-ODA), 4,4'-diaminodiphenyl ether (4,4'-ODA), m-xylylenediamine (MXDA), and p-xylylenediamine (PXDA).

Non limitative examples of amine (CAL) are notably selected from the group consisting of isophoronediamine (also known as 5-amino-(1-aminomethyl)-1,3,3-trimethylcyclohexane), 1,3-cyclohexanebis(methylamine) (1,3-BAMC), 1,4-cyclohexanebis(methylamine) (1,4-BAMC), 4,4-diaminodicyclohexylmethane (PACM), and bis(4-amino-3-methylcyclohexyl)methane.

The aromatic aminoacid component (ArN) comprises at least one aromatic aminoacid or derivative thereof; said aromatic amino-acid is generally selected from the group consisting of 4-(aminomethyl)benzoic acid and 4-aminobenzoic acid.

According to said first embodiment, the aromatic polyamide can comprise recurring units different from recurring units ($R_{PPA}$) as above described derived from polycondensation of monomers listed under paragraphs (i-1) [acid component (AA)], (i-2) [amine component (NN)] and (i-3) [aminoacid component (ArN)]; said additional recurring units ($R_{PA}$) are generally recurring units derived from polycondensation of an aliphatic or cycloaliphatic aminoacid component, including notably 6-aminohexanoic acid, 1-aza-2-cyclononanone, 1-aza-2-cyclododecanone, 11-aminoundecanoic acid, 12-aminododecanoic acid, 4-(aminomethyl)benzoic acid, cis-4-(aminomethyl)cyclohexanecarboxylic acid, trans-4-(aminomethyl)cyclohexanecarboxylic acid, cis-4-aminocyclohexanecarboxylic acid and trans-4-aminocyclohexanecarboxylic acid.

According to a second embodiment, the aromatic polyamide comprises recurring units ($R_{PXA}$) deriving from polycondensation reaction of:
(i-1) a dicarboxylic acid component [acid component (AA')], wherein said acid component (AA') comprises at least one non-aromatic dicarboxylic acid or derivative thereof [acid (AL')]; and
(i-2) a diamine component [amine component (NN')] comprising at least one aromatic diamine [amine (AR')].

The acid component (AA') may comprise in addition to said at least one non-aromatic dicarboxylic acid [acid (AL')], one or more than one aromatic dicarboxylic acid [acid (AR')].

Acids (AL'), acids (AR') and amine (AR') suitable for being used in the aromatic polyamides of this second embodiment are the same as those above described respectively as acids (AL), acids (AR) and amine (AR) herein above, and are hereby described with reference to what specified above.

Said acid (AL') is preferably selected from the group consisting of oxalic acid [HOOC—COOH, malonic acid (HOOC—$CH_2$—COOH), adipic acid [HOOC—$(CH_2)_4$—COOH], succinic acid [HOOC—$(CH_2)_2$—COOH], glutaric acid [HOOC—$(CH_2)_3$—COOH], 2,2-dimethyl-glutaric acid [HOOC—$C(CH_3)_2$—$(CH_2)_2$—COOH], 2,4,4-trimethyl-adipic acid [HOOC—$CH(CH_3)$—$CH_2$—$C(CH_3)_2$—$CH_2$—COOH], pimelic acid [HOOC—$(CH_2)_5$—COOH], suberic acid [HOOC—$(CH_2)_6$—COOH], azelaic acid [HOOC—$(CH_2)_7$—COOH], sebacic acid [HOOC—$(CH_2)_8$—COOH], undecanedioic acid [HOOC—$(CH_2)_9$—COOH], dodecandioic acid [HOOC—$(CH_2)_{10}$—COOH], tetradecandioic acid [HOOC—(CH$_2$)$_{11}$—COOH], cis- and/or trans-cyclohexane-1,4-dicarboxylic acid and/or cis- and/or trans-cyclohexane-1,3-dicarboxylic acid (CHDA).

Said acid (AL') is more preferably adipic acid.

The acid component (AA') according to these preferred embodiments comprises said adipic acid in an amount of at least 35%, preferably at least 50% moles, based on the all components of the acid component (AA').

The diamine component [amine component (NN')] comprises at least one aromatic diamine [amine (AR')]. Said amine (AR') are notably selected from the group consisting of m-phenylene diamine (MPD), p-phenylene diamine (PPD), 3,4'-diaminodiphenyl ether (3,4'-ODA), 4,4'-diaminodiphenyl ether (4,4'-ODA), m-xylylenediamine (MXDA), and p-xylylenediamine (PXDA).

Said amine (AR') is more preferably m-xylylenediamine (MXDA).

The amine component (NN') according to these preferred embodiments comprises said meta-xylylene diamine in an amount of at least 35%, preferably at least 50% moles, based on the all components of the amine component (NN').

The amine component (NN') can comprise, in addition to said amine (AR'), one or more than one non-aromatic diamines, preferably selected from the group consisting of aliphatic alkylene-diamines [amine (AL)], as above detailed with reference to first embodiment, and cycloaliphatic diamines [amine (CAL)], said cycloaliphatic diamines being preferably selected from the group consisting of isophoronediamine (also known as 5-amino-(1-aminomethyl)-1,3,3-trimethylcyclohexane), 1,3-cyclohexanebis(methylamine) (1,3-BAMC), 1,4-cyclohexanebis(methylamine) (1,4-BAMC), 4,4-diaminodicyclohexylmethane (PACM), and bis(4-amino-3-methylcyclohexyl)methane.

A second group of preferred polyamides (A) are those consisting essentially of recurring units formed by polycondensation reaction between adipic acid and meta-xylylene diamine. In the rest of the text, this second group of polyamides (A) is named, for the purposes of the invention, as PAMXD6 polymers.

PAMXD6 polymers are notably commercially available as IXEF® polyamides from Solvay Specialty Polymers USA, L.L.C.

The molecular weight of the PAMXD6 polymer is not particularly limited. The PAMXD6 has advantageously a number average molecular weight (M$_n$) of at least 2,500, more preferably of at least 5,000, more preferably of at least 10,000 and still more preferably of at least 13,000. In addition, the PAMxD.6 has advantageously a number average molecular weight (M$_n$) of at most 60,000, more preferably of at most 50,000 and still more preferably of at most 30,000.

M$_n$ can be calculated according to the following formula:

$$M_n = 2 \times 10^6 / \Sigma(\text{—COOH end groups}) + (\text{—NH}_2 \text{ end groups})$$

wherein (—COOH end groups)=number of acid end groups in µequivalents/gram of product resin (titrated with a base) and wherein (—NH$_2$ end groups)=number of basic end groups in µequivalents/gram of product resin (titrated with an acid).

Non limitative examples of aromatic polyamides according to the present invention are: the polymer of adipic acid with meta-xylylene diamine, the polymer of terephthalic acid with 1,9-nonamethylenediamine, the polymer of terephthalic acid with 1,10-decamethylenediamine, the polymer of terephthalic acid with dodecamethylenediamine, the polymer of 1,11-undecanediamine with terephthalic acid, the copolymer of terephthalic acid and isophthalic acid with hexamethylenediamine, the copolymer of terephthalic acid with hexamethylenediamine and decamethylenediamine; the copolymer of terephthalic acid and isophthalic acid with hexamethylenediamine and decamethylenediamine; the copolymer of terephthalic acid with decamethylenediamine and 11-amino-undecanoic acid, the copolymer of terephthalic acid with hexamethylenediamine and 11-amino-undecanoic acid; the copolymer of terephthalic acid with hexamethylenediamine and bis-1,4-aminomethylcyclohexane; the copolymer of terephthalic acid with hexamethylenediamine and bis-1,3-aminomethylcyclohexane; the copolymer of hexamethylenediamine with terephthalic acid and 2,6-napthalenedicarboxylic acid; the copolymer of hexamethylenediamine with terephthalic acid and sebacic acid; the copolymer of hexamethylenediamine with terephthalic acid and 1,12-diaminododecanoic acid; the copolymer of hexamethylenediamine with terephthalic acid, isophthalic acid and 1,4-cyclohexanedicarboxylic acid; the copolymer of decamethylenediamine with terephthalic acid and 4-aminocyclohexanecarboxylic acid; the copolymer of decamethylenediamine with terephthalic acid and 4-(aminomethyl)-cyclohexanecarboxylic acid; the polymer of decamethylenediamine with 2,6-napthalenedicarboxylic acid; the copolymer of 2,6-napthalenedicarboxylic acid with hexamethylenediamine and decamethylenediamine; the copolymer of 2,6-napthalenedicarboxylic acid with hexamethylenediamine and decamethylenediamine; the copolymer of hexamethylenediamine with 11-amino-undecanoic acid and 2,6-napthalenedicarboxylic acid; the copolymer of terephthalic acid with hexamethylenediamine and 2-methylpentamethylenediamine; the copolymer of terephthalic acid with decamethylenediamine and 2-methylpentamethylenediamine, and the copolymer of 2,6-napthalenedicarboxylic with hexamethylenediamine and 2-methylpentamethylenediamine.

According to a second aspect of the present invention, the composition (C) comprises preferably at least one aliphatic polyamide polymer.

For the purpose of the present invention, the expression "aliphatic polyamide polymer" is intended to denote a polyamide that comprises aliphatic recurring units exclusively and said aliphatic recurring units are derived from at least one acid (AL), as mentioned above, and at least one amine (AL) and/or at least one cycloaliphatic diamine [amine (CAL)], as mentioned above and/or said aliphatic recurring units are derived from aliphatic aminocarboxylic acids and/or aliphatic lactams.

The aliphatic groups are generally simple unsubstituted straight chains of methylene groups, but they may be substituted or branched.

Non limitative examples of aliphatic lactams are notably selected from the group consisting of caprolactam and lauryl lactam.

Among the above listed acids (AL), a preference is given to the following ones: adipic acid [HOOC—(CH$_2$)$_4$—COOH], succinic acid [HOOC—(CH$_2$)$_2$—COOH], suberic acid [HOOC—(CH$_2$)$_6$—COOH], azelaic acid [HOOC—(CH$_2$)$_7$—COOH], sebacic acid [HOOC—(CH$_2$)$_8$—COOH], undecanedioic acid [HOOC—(CH$_2$)$_9$—COOH], dodecandioic acid [HOOC—(CH$_2$)$_{10}$—COOH], cis- and/or trans-cyclohexane-1,4-dicarboxylic acid and cis- and/or trans-cyclohexane-1,3-dicarboxylic acid (CHDA).

Among the above listed amines (AL), a preference is given to the following ones: 1,5-diaminopentane, 1,6-diaminohexane, 1,8-diamino-octane, 1,6-diamino-2,2,4-trimethylhexane, 1,6-diamino-2,4,4-trimethylhexane, 1,9-diaminononane, 1,10-diaminodecane, 1,9-diamino-5-methylnonane, 1,11-diaminoundecane and 1,12-diaminododecane.

Among the above listed amine (CAL), a preference is given to the following ones: isophoronediamine, 1,4-cyclohexanebis(methylamine) (1,4-BAMC), 4,4-diaminodicyclohexylmethane (PACM), and bis(4-amino-3-methylcyclohexyl)methane.

Non limitative examples of aliphatic polyamides according to the present invention are: the polymer of decamethylenediamine with 1,4-cyclohexanedicarboxylic acid, the copolymer of 1,4-cyclohexanedicarboxylic acid with decamethylenediamine and 2-methylpentamethylenediamine, the polymer of hexamethylenediamine with sebacic acid, the polymer of 1,10-diaminodecane with sebacic acid, the polymer of caprolactam, the polymer of hexamethylenediamine with adipic acid, the polymer of 11-aminoundecanoic acid, the polymer of laurolactam, the polymer of hexamethylenediamine with sebacic acid and the polymer of 1,10-diaminodecane with sebacic acid.

In particular, the aliphatic polyamide polymer may be a polyamide obtained by a process of polymerization of the above described monomers of polyamide, further in the presence of branch-point monomers, i.e. difunctional compounds comprising carboxylic acid or amine functional groups and/or polyfunctional compound exhibiting at least 3 carboxylic acid or amine functional groups.

In a specific embodiment, the aliphatic polyamide comprises aliphatic recurring units derived from:
(i) at least one acid (AL), as mentioned above, and at least one amine (AL) and/or at least one cycloaliphatic diamine [amine (CAL)], as mentioned above and/or aliphatic aminocarboxylic acids and/or aliphatic lactams;
(ii) a difunctional compound comprising 2 functional groups X1 and/or a polyfunctional compound comprising at least 3 functional groups X1; the functional groups X1 being carboxylic acid functional groups or amine functional groups capable of reacting with the acid (AL), amine (AL) and/or amine (CAL) and/or aliphatic aminocarboxylic acids and/or aliphatic lactams (i) and of forming an amide bond.

The difunctional compounds are different from the above described acid (AL), amine (AL), amine (CAL) and aliphatic aminocarboxylic acids.

In the polymerization process for making such an aliphatic polyamide, use may advantageously be made of 0.05 to 0.5 mol %, preferably of 0.2 to 0.5 mol %, more preferably of 0.25 to 0.4 mol %, of difunctional compounds and/or polyfunctional compounds, with respect to the sum of the number of moles of constituent monomers of the polyamide, in particular 0.25, 0.5, 0.1, 0.15, 0.2, 0.25, 0.3, 0.35 and 0.4 mol %.

These difunctional and/or polyfunctional compounds have amine or carboxylic acid functional groups capable of reacting with the monomers of the polyamide. The difunctional compounds may have the same amine or carboxylic acid functionality. The amine functional groups may be primary and/or secondary amine functional groups.

It is possible to use, at the start, during or at the end of the polymerization all types of such difunctional and/or polyfunctional compounds.

Mention may in particular be made, as difunctional compounds, of aliphatic or aromatic dicarboxylic acids having from 4 to 12 carbon atoms, such as adipic acid, terephthalic acid, isophthalic acid, oxalic acid, malonic acid, succinic acid, sebacic acid, azelaic acid, suberic acid, glutaric acid, pimelic acid, decanedioic acid or dodecanedioic acid.

Mention may also in particular be made, as difunctional compounds, of aliphatic, optionally cycloaliphatic, or aromatic diamines having from 4 to 12 carbon atoms, such as hexamethylenediamine, butanediamine, 5-methylpentamethylenediamine, m-xylylenediamine, isophoronediamine, 1,4-diaminocyclohexane and 3,3',5-trimethylhexamethylenediamine.

The polyfunctional compound comprises at least 3, preferably between 3 and 10, more preferably 3 or 4, functional groups X1; X1 being a carboxylic acid functional group or an amine functional group capable of reacting with the constituent monomers of the polyamide and of forming an amide bond.

The functional group X1 is preferably a carboxylic acid functional group or a primary or secondary amine functional group, of their salts.

Examples of polyfunctional compounds which may be suitable are mentioned in particular in U.S. Pat. No. 5,346, 984, U.S. Pat. No. 5,959,069, WO 96/35739 and EP 672 703.

Mention may in particular be made, as example of polyfunctional compounds carrying carboxylic acid functional groups X1, of 2,2,6,6-tetra(β-carboxyethyl)cyclohexanone, diaminopropane-N,N,N',N'-tetraacetic acid, 3,5,3',5'-biphenyltetracarboxylic acid, acids derived from phthalocyanin and naphthalocyanin, 1,3,5,7-naphthalenetetracarboxylic acid, 2,4,6-pyridinetricarboxylic acid, 3,5,3',5'-bipyridyltetracarboxylic acid, 3,5,3',5'-benzophenonetetracarboxylic acid, 1,3,6,8-acridine-tetracarboxylic acid, trimesic acid, 1,2,4,5-benzenetetracarboxylic acid and 2,4,6-tri(aminocaproic acid)-1,3,5-triazine (TACT).

Mention may be made, as example of polyfunctional compounds carrying amine functional groups X1, of nitrilotrialkylamines, in particular nitrotriethyl-amine, dialkylenetriamines, in particular diethylenetriamine, bishexamethylenetriamine, trialkylenetetramines and tetraalkylenepentamines, the alkylene preferably being ethylene, 4-aminoethyl-1,8-octanediamine, melamine, compounds originating from the reaction of trimethylolpropane or of glycerol with propylene oxide and amination of the end hydroxyl groups (Jeffamine T® from Huntsman).

Excellent results were obtained when using Jeffamine T403® (polyoxypropylenetriamine) from Huntsman as the polyfunctional compound.

More specifically, the aliphatic polyamide polymer may be a polyamide of PA 6,6 type obtained by a process of polymerization of monomers of polyamide PA 6,6, that is to say adipic acid and hexamethylenediamine (or salts thereof such as hexamethylenediamine adipate), in the presence, in addition, of the above described difunctional and/or polyfunctional compounds.

This specific polyamide of PA 6,6 type and the process to make it have been described in great details in WO 2007/113262, WO 2009/050268 and in WO 2011/039183, the whole contents of them being incorporated herein by reference for all purposes, and are commercially available under the trademark TechnylStar® polyamide.

It is also possible to use an excess of adipic acid or an excess of hexamethylenediamine for the production of a polyamide of type PA-6,6.

Preferably, the proportion of terminal acid groups is different from the proportion of terminal amine groups, in particular at least two times higher or lower. The amounts of terminal amine groups (TAG) and/or terminal acid groups (TCG) are determined by potentiometric assays after dissolution of the polyamide. One method is, for example, described in "Encyclopedia of Industrial Chemical Analysis", volume 17, page 293, 1973.

According to a third aspect of the present invention, the composition (C) comprises preferably at least one aliphatic polyamide polymer and at least one aromatic polyamide polymer.

In particular, mixtures of more than one aromatic polyamide comprising recurring units ($R_{PXA}$), mixtures of more than one aromatic polyamide comprising recurring units ($R_{PPA}$), mixtures of more than one aliphatic polyamide, and mixtures comprising at least one aliphatic polyamide in combination with at least one aromatic polyamide comprising recurring units ($R_{PXA}$), and/or at least one aromatic polyamide comprising recurring units ($R_{PPA}$) can advantageously be used in the composition (C).

For example, the following mixtures comprising at least one aliphatic polyamide polymer and at least one aromatic polyamide polymer are good candidates for the polyamide (A) of the composition (C): blends of aromatic polyamides such as PA 9T, PA 10T, PMXD6, PA 6T/6I, PA 6T/10T, and PA 10T/10I with aliphatic polyamides such as PA 6, PA 6,6, PA 10,10, PA11, PA12, PA 6,12 and PA 6,10.

According to the present invention, the polyamide (A) can further comprise an end capping agent [agent (M)] selected from the group consisting of an acid comprising only one reactive carboxylic acid group [acid (MA)] and an amine comprising only one reactive amine group [agent (MN)].

The expression 'acid comprising only one reactive carboxylic acid group' is intended to encompass not only mono-carboxylic acids but also acids comprising more than one carboxylic acid group or derivative thereof, but wherein only one of said carboxylic acid group has reactivity in polycondensation reaction with component (NN).

It is nevertheless generally preferred that said acid (MA) comprises only one carboxylic acid group.

Thus, acid (MA) is preferably selected from the group consisting of acetic acid, propionic acid, butyric acid, valeric acid, caproic acid, caprylic acid, lauric acid, stearic acid, cyclohexanecarboxylic acid, benzoic acid, preferably from acetic acid and benzoic acid.

Similarly, the expression 'amine comprising only one reactive amine group' is intended to encompass not only mono-amine but also amines comprising more than one amine group or derivative thereof, but wherein only one of said amine group has reactivity in polycondensation reaction with component (AA).

It is nevertheless generally preferred that said amine (MN) comprises only one amine group.

When present, the overall amount of agent (M) in polymer (A), computed as:

$$\text{agent }(M)\text{ (\% moles)} = \left[\frac{\text{moles of agent }(MA)}{\text{total moles of acid component }(AA)} + \frac{\text{moles of agent }(MN)}{\text{total moles of amine component }(NN)}\right] \cdot 100$$

is comprised between 0 and 6% moles, being understood that the agent (M) might advantageously be agent (MA) alone, agent (MN) alone or a combination thereof. In other words, in above mentioned formula, the amount of agent (MA) with respect to the total moles of acid component (AA) can be from 0 to 6% moles, the amount of agent (MN) with respect to the total moles of amine component (NN) can be from 0 to 6% moles.

According to the present invention, when the polyamide (A) is an aliphatic polyamide, it has advantageously a relative viscosity of less than 2.50, preferably less than 2.45, more preferably less than 2.40 when measured in 96% $H_2SO_4$ according to ASTM D4878.

Also, the aliphatic polyamide according to the present invention has advantageously a melt flow index (MFI) greater than or equal to 10 g/10 min according to the standard ISO 1133 measured at a temperature of 275° C. with a load of 325 g, preferably between 10 and 50 g/10 min, more preferably between 15 and 50 g/10 min and more preferably still between 20 and 40 g/10 min.

According to the present invention, when the polyamide (A) is an aromatic polyamide, it has advantageously a intrinsic viscosity of less than 0.95, preferably less than 0.90, more preferably less than 0.85, still more preferably less than 0.80, and most preferably less than 0.75 when measured in a phenol/tetrachloroethane 60/40 (wt/wt) mixture at a temperature of Tm+15° C., Tm being the melting temperature of the aromatic polyamide.

The nature of the polyamide (A) of the composition (C) will be selected by the one skilled in the art to best fit the requirements of the frame depending on where and how the solar panel is to be mounted. For example, solar panels suitable for rooftop applications are not necessarily suitable for ground mounted applications. Moreover, other factors such as the climate, the inclination of the solar panel and the maximum weight requirement also influence the choice of the polyamide(s) (A) to be used in the composition (C).

The weight percent of the polyamide (A) in the composition (C) is generally of at least 25 wt. %, preferably of at least 35 wt. %, more preferably of at least 40 wt. % and most preferably of at least 45 wt. %, based on the total weight of composition (C). The weight percent of the filler (F) is generally of at most 80 wt. %, preferably of at most 70 wt. % and most preferably of at most 60 wt. %, based on the total weight of the composition (C). Good results were obtained when about 50 wt. % of the polyamide (A) was present, based on the total weight of the composition (C).

Reinforcing fillers [fillers (F)] which are suitable to be used in the composition (C) of the invention are well known by the skilled in the art.

Having regards to the reinforcement material morphology, the filler (F) of the composition (C) is generally selected from the group consisting of fibrous fillers and particulate fillers.

Typically, the filler (F) is selected from the group consisting of mineral fillers (such as talc, mica, kaolin, calcium carbonate, calcium silicate, magnesium carbonate), glass fiber, carbon fibers, synthetic polymeric fiber, aramid fiber, aluminum fiber, titanium fiber, magnesium fiber, boron carbide fibers, rock wool fiber, steel fiber, wollastonite, inorganic whiskers. Still more preferably, it is selected from mica, kaolin, calcium silicate, magnesium carbonate, inorganic whiskers, glass fiber and wollastonite.

A particular class of fibrous fillers which are advantageously usable in the composition (C) consists of whiskers, i.e. single crystal fibers made from various raw materials, such as $Al_2O_3$, SiC, BC, Fe and Ni.

According to certain preferred embodiments, the filler (F) is selected from the group consisting of fibrous fillers. Among fibrous fillers, glass fibers are preferred; non (imitative examples of glass fibers include notably chopped strand A-, E-, C-, D-, S- and R-glass fibers, as described in chapter 5.2.3, p. 43-48 of Additives for Plastics Handbook, 2nd edition, John Murphy, the whole content of which is herein incorporated by reference. Glass fibers fillers useful in composition (C) may have a round cross-section or a non-circular cross-section.

In a preferred embodiment of the present invention, the filler (F) is selected from the group consisting of wollastonite fillers and glass fiber fillers. Excellent results were obtained when wollastonite and/or glass fibers were used.

Glass fibers optionally comprised in composition (C) may have a circular cross-section or a non-circular cross-section (such as an oval or rectangular cross-section). Excellent results were obtained when glass fibers with a non-circular cross-section were used in the composition (C).

The weight percent of the filler (F) in the composition (C) is generally of at least 5 wt. %, preferably of at least 10 wt. %, more preferably of at least 20 wt. % and most preferably of at least 40 wt. %, based on the total weight of composition (C). The weight percent of the filler (F) is generally of at most 80 wt. %, preferably of at most 70 wt. % and most preferably of at most 60 wt. %, based on the total weight of the composition (C). Good result were obtained at about 50 wt. % of the filler (F), based on the total weight of the composition (C).

Excellent results were obtained when the filler (F) was used in an amount of 10-80 wt. %, preferably of 40-60 wt. %, based on the total weight of the composition (C).

Optional Ingredients

The composition (C) can optionally comprise additional components which serve to improve the stability, in particular stabilizing additives, including notably mould release agents, plasticizers, lubricants, thermal stabilizers, light stabilizers and antioxidants etc.; to improve the flammability resistance (FR), to improve the chemical resistance to Heat Transfer Fluid (HTF, such as notably Glycol, . . . ), and to allow to tune the color of the framing structure of the present invention.

Certain stabilizers such as hindered amine light stabilizers (HALS) may be present in the composition. For example one or more of the group of hindered amines selected from the group bis(2,2,6,6-tetramethylpiperidin-4-yl)sebacate, bis (I,2,2,6,6-pentamethyl piperidin-4-yl)sebacate, di(I,2,2,6,6-pentamethylpiperidin-4-yl) (3,5-di-tert-butyl-4-hydroxybenzyl)butylmalonate, the polycondensation product of I-(2-hydroxyethyl)-2,2,6,6-tetramethyl-4-hydroxypiperidine and succinic acid, the polycondensation product of 2,4-dichloro-6-tert-octylamino-s-triazine and 4,4'-hexamethylenebis (amino-2,2,6,6-tetramethylpiperidine), N,N',N",N"'-tetrakis [(4,6-bis(butyl-(1,2,2,6,6-pentamethylpiperidin-4-yl) amino)-s-triazine-2-yl]-1, 10-diamino-4,7-diazadecane, di-(1-octyloxy-2,2,6,6-tetramethylpiperidin-4-yl)sebacate, di-(1-cyclohexyloxy-2,2,6,6-tetramethylpiperidin-4-yl) succinate, I-octyloxy-2,2,6,6-tetramethyl-4-hydroxypiperidine, poly-{[6-tert-octylamino-s-triazin-2,4-diyl][2-(1-cyclohexyloxy-2,2,6,6-tetramethylpiperidin-4-yl)imino-hexamethylene-[4-(I-cyclohexyloxy-2,2,6,6-tetramethylpiperidin-4-yl)imino], or 2,4,6-tris[N—(I-cyclohexyloxy-2,2,6,6-tetramethylpiperidin-4-yl)-n-butylamino]-s-triazine may be present in the composition according to the present invention.

Suitable UV stabilizers may notably selected from the group consisting of s-triazines, oxanilides, hydroxybenzo-phenones, benzoates and α-cyanoacrylates.

The thermal stabilizers commonly used in polyamide compositions are well known in the art. They can typically be one or more selected from, 3,9-bis[1,1-dimethyl-2-[(3-tert-butyl-4-hydroxy-5-methylphenyl)propionyloxy]ethyl]-2,4,8,10-tetraoxaspiro[5.5]undecane, pentaerythritol tetrakis (3-(3,5-di-tert-butyl-4-hydroxyphenyl)propionate), 3,3'-bis (3,5-di-tert-butyl-4-hydroxyphenyl)-N,N'-hexamethylenedipropionamide, 1,3,5-tris(3,5-di-(tert)-butyl-4-hydroxybenzyl)-1,3,5-triazine-2,4,6(1H,3H,5H)-trione, 1,3,5-triazine-2,4,6(1H,3H,5H)-trione,1,3,5-tris[[4-(1,1-dimethylethyl)-3-hydroxy-2,6-dimethylphenyl] methyl], benzenepropanoic acid, 3-(1,1-dimethylethyl)-b-[3-(1,1-dimethylethyl)-4-hydroxyphenyl]-4-hydr oxy-b-methyl-, 1,1-(1,2-ethanediyl)ester, bis(1,2,2,6,6-pentamethyl-4-piperidyl) [[3,5-bis(1,1-dimethylethyl)-4-hydroxyphenyl]methyl]butylmalonate, 2-(4,6-diphenyl-1,3,5-triazin-2-yl)-5-((hexyl)oxyl-phenol, 2,4,8,10-tetraoxa-3,9-diphodphaspiro[5,5]undecane, 3,9-bis[2,6-bis-1,1-dimethylethyl]-4-methylphenoxy], 12H dibenzo[d,g][1,3,2] dioxaphosphocin, 2,4,8,10-tetrakis(1,1-dimethylethyl)-6-[(2-ethylhexyl)oxy], 2,4,8,10-tetraoxa-3,9-diphosphaspiro [5.5]undecane, 3,9-bis[2,4-bis(1-meth yl-1-phenylethyl) phenoxy], tris(2,4-di-(tert)-butylphenyl)phosphate, bis-2,4-di-tert-butylphenyl)pentaerythritol diphosphite, 2,4,8,10-tetraoxa-3,9-diphosphaspiro[5.5]undecane, 3,9-bis (octadecyloxy), 2,4,8,10-tetraoxa-3,9-diphosphaspiro[5.5] undecane, 3,9-bis[2,4-bis(1-methyl-1-phenylethyl) phenoxy], 2-(tert-Butyl)-6-methyl-4-(3-((2,4,8,10-tetrakis (tert-butyl)dibenzo[d,f][1,3,2]dioxaphosphepin-6-yl)oxy) propyl)phenol and bis[4-(2-phenyl-2-propyl)phenyl]amine.

Suitable flame resistant or flame retardants, that may be used in the present invention include, but are not limited to organic compounds (especially halogenated, phosphor-containing, such as tricresyl phosphate, tris(2-chloroethyl) phosphate, tris(chloropropyl) phosphate and tris(2,3-dibromopropyl) phosphate, and nitrogen-containing organic compounds) and inorganic phosphorus compounds (for example, red phosphor, ammonium polyphosphate), inorganic metal hydroxides (for example, aluminum trihydroxide, aluminum oxide hydrate, ammonium polyphosphate, sodium polymetaphosphate or amine phosphates, such as melamine phosphates) and inorganic boron compounds (for example, boric acid, borax).

Examples of commercially available flame retardants that may be employed include, for example: Disflamoll® DPK (diphenyl cresyl phosphate), Levagard® DMPP (dimethyl propanephosphonate), Levagard® PP (tris(2-chloroisopropyl) phosphate), melamine, Exolit® AP 422 (a free flowing powdery, hardly water-soluble ammonium polyphosphate of formula $(NH_4PO_3)_n$ with n=20 to 1000, especially from 200 to 1000), Apyral® $(Al(OH)_3)$.

The weight percent of the additional components in the composition (C) is generally of at least 1 wt. %, preferably of at least 2 wt. %, more preferably of at least 5 wt. % and most preferably of at least 10 wt. %, based on the total weight of composition (C). The weight percent of the additional components is generally of at most 30 wt. %, preferably of at most 20 wt. % and most preferably of at most 15 wt. %, based on the total weight of the composition (C).

Thanks to the peculiar properties of the composition (C), the frame of the present invention shows excellent colorability and retention of color after exposure to UV irradiation.

As coloring agents for the coloring of the framing structure made from the composition (C), mention can be notably made of per se known dyes and/or color pigments, organically and/or inorganically based. Suitable inorganic pigments may be selected from carbon black, zinc sulfide, azurite, β-malachite, γ-malachite, pseudo-malachite, jarosite, massicot, orpiment, natrojarosite, realgar, vermillion, cinnabar, zinc sulfide, zinc sulfide crystallized in the cubic system, zinc sulfide crystallized in the hexagonal system, wurtzite, matraite, sphalerite, blende, cleiophane, cramerite, sachtolith, lithopone, red seal lithopone, silver seal lithopone, lead carbonate, cerussite, white lead, lead sulfate, lead silicate, zinc oxide, iron oxide, chromium oxide, antimony trioxide, antimony trioxide, valentinite, and mixtures thereof, preferably zinc sulfide (preferably in the wurtzite crystalline form) and sachtolith (wherein the zinc sulfide is mainly in the wurtzite crystalline form). Suitable organic pigments may be selected from phthalocyanine- and/or monoazo-based pigments. Excellent results were obtained when using carbon black.

It has been found that the frame structure (including all its structural parts) made from the composition (C) of the present invention advantageously meets the wet leakage current and/or high potential standards as defined in UL 1703, Article 690 of the 2005 NEC and UL 1703, edition 3, as revised April 2008, which are incorporated by reference herein.

The composition (C) can be prepared by a variety of methods involving intimate admixing of the polymer materials with any optional ingredient, as detailed above, desired in the formulation, for example by melt mixing or a combination of dry blending and melt mixing. Typically, the dry blending of the polyamide (A), the filler (F) and all other optional ingredients, as above details, is carried out by using high intensity mixers, such as notably Henschel-type mixers and ribbon mixers.

So obtained powder mixture can be suitably used as such, or can be a concentrated mixture to be used as masterbatch and diluted in further amounts of the polyamide (A) and the filler (F), in subsequent processing steps.

It is also possible to manufacture composition (C) of the invention by further melt compounding the powder mixture as above described. As said, melt compounding can be effected on the powder mixture as above detailed, or directly on the polyamide (A) and the filler (F) and any other possible ingredient, Conventional melt compounding devices, such as co-rotating and counter-rotating extruders, single screw extruders, co-kneaders, disc-pack processors and various other types of extrusion equipment can be used. Preferably, extruders, more preferably twin screw extruders can be used.

Specially designed extruders, known to the person skilled in the art may be used for melting, blending, extruding and pelletizing composition (C).

The design of the compounding screw, e.g. flight pitch and width, clearance, length as well as operating conditions will be advantageously chosen so that sufficient heat and mechanical energy is provided to advantageously fully melt the powder mixture or the ingredients as above detailed and advantageously obtain a homogeneous distribution of the different ingredients, but still mild enough to advantageously keep the processing temperature of the composition below the decomposition temperature of any of the components of the composition (C). It is advantageously possible to obtain strand extrudates of the composition (C) of the invention. Such strand extrudates can be chopped by means e.g. of a rotating cutting knife aligned downwards the die plate, generally with an underwater device, which assures perfect cutting knife to die plate alignment, and collected under the form of pellets or beads. Thus, for example composition (C) which can be provided in the form of pellets or beads can then be further used for the manufacture of a framing structure for a solar module.

A further object of the invention is a process for the manufacturing of a framing structure for a solar module made from a polymer composition (C) comprising at least one polyamide polymer [polyamide (A)], and at least one reinforcing filler [filler (F)], as detailed above, the framing structure being characterized by having a top surface and a bottom surface, said top surface having a depressed central portion sized for receiving a solar module.

The process for manufacturing the framing structure of the invention can be realized by any convention technique known for the processing of thermoplastics, as well as combination thereof.

According to certain embodiments the process can comprise molding straight profiles and cutting, machining and assembling the same by any suitable technique, including gluing, fastening, welding and the like. Adhesives which have been found particularly advantageous for assembling solar panel onto the structural frame of the invention are notably polyurethane adhesives.

According to other embodiments, the process advantageously comprises molding the framing structure as unitary assembly. Preferred technique for molding such unitary assembly will be generally injection molding techniques, wherein the composition (C) is injected in a mold at a temperature beyond melting temperature of the polyamide (A).

Various injection molding techniques may be used. Generally, in all those techniques, the mold will be equipped with multiple injection units. Critical variables such as draft and mold temperature must be considered when using either of these processes. One skilled in the art will recognize the factors influencing injection moldability including the material's stress relaxation properties and the temperature dependence of melt viscosity and exact conditions may be determined by trial and error molding of small samples.

Powders, pellets, beads, flakes, reground material or other forms of the composition (C) may be molded, with or without liquid or other additives, premixed or fed separately.

In cases wherein the structural frame is conceived to be equipped with one or more that one metal inserts (or other material inserts), the process will comprise molding the composition (C) in a mold hosting said inserts, so that the same are stably and securely embedded in the structural frame.

The invention further pertains to a method for assembly a solar panel into said framing structure.

According to certain embodiments, said method can comprise deforming the framing structure from its initial shape for enabling introduction of the solar panel in its depressed central portion, introducing said solar panel in said depressed central portion, and restoring the framing structure to its initial shape. Thanks to the inherent low deformation elasticity of the composition (C), this technique can be advantageously applied to the assembling of solar panels into framing structure. It is generally understood that the deformation required is generally limited and will not go beyond 2%, within which limits, the frame structure made from the composition (C) advantageously possesses an elastic behaviour.

The assembling process of the invention may comprise additional techniques for safely fastening the solar panel to the framing structure, including, but not limited to, gluing, fastening with any fastening means and the like.

Therefore, still another object of the invention pertains to a method for assembling a solar panel into the framing structure according to the present invention, said method comprising gluing the framing structure to at least one other components of the solar panel.

Adhesives which have been found particularly advantageous for assembling solar panel onto the structural frame of the invention are notably polyurethane and silicone adhesives.

The invention further pertains to a solar panel assembly comprising the framing structure as above detailed.

Finally, still another object of the invention is a method for fixing said solar panel assembly onto a support.

Such support can be a self-standing support conceived only to hold and possibly move following incident radiation direction the solar panels or can be a non-moving support on which the solar panels can be affixed, like a roof or a wall of an existing building.

Generally, the method will comprise fastening the structural frame onto the mounting systems, as described above, fixed onto the substrate.

The invention claimed is:

1. A framing structure for a solar panel, comprising a top surface and a bottom surface, said top surface having a depressed central portion sized for receiving a solar panel, and being made from a polymer composition, said polymer composition comprising at least one polyamide polymer, and 5 wt. %-80 wt. % of at least one reinforcing filler, wherein the top surface comprises a perimeter wall having a thickness of 1 mm to 4 mm, and the bottom surface comprises a perimeter wall having a thickness of 1 mm to 6 mm, wherein the polyamide polymer comprises recurring units derived from a polycondensation reaction of:
   a dicarboxylic acid component comprising at least one non-aromatic dicarboxylic acid or derivative thereof; and
   a diamine component comprising at least 35 mol. % of m-xylylenediamine or p-xylylenediamine.

2. The framing structure of claim 1, which is unitary-bodied.

3. The framing structure according to claim 1 comprising at least one type of supporting means.

4. The framing structure of claim 3, wherein said supporting means are supporting ribs.

5. The framing structure according to claim 1 comprising at least one type of fixing means.

6. The framing structure according to claim 1 comprising means for bolting a number of framing structures together.

7. The framing structure according to claim 1, comprising at least one junction box.

8. The framing structure according to claim 1, comprising means for cable routing and/or receptacles for collecting surface water and/or rain water.

9. The framing structure according to claim 1 comprising 40 wt. % to 60 wt. % of the reinforcing filler.

10. The framing structure according to claim 1, wherein the perimeter wall of the top surface has a thickness of 1 mm to 3 mm.

11. The framing structure according to claim 1, wherein the perimeter wall of the bottom surface has a thickness of 1 mm to 4 mm.

12. The framing structure according to claim 1, wherein the perimeter wall on a first side comprises a first interlocking portion and the perimeter wall on a second side comprises a second interlocking portion, and wherein the first interlocking portion is configured to engage the second interlocking portion.

* * * * *